(12) United States Patent
Chih et al.

(10) Patent No.: US 8,391,073 B2
(45) Date of Patent: Mar. 5, 2013

(54) ADAPTIVE CONTROL OF PROGRAMMING CURRENTS FOR MEMORY CELLS

(75) Inventors: Yue-Der Chih, Hsin-Chu (TW); Ping Wang, Hsin-Chu (TW); Cheng-Hsiung Kuo, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 193 days.

(21) Appl. No.: 12/915,310

(22) Filed: Oct. 29, 2010

(65) Prior Publication Data

US 2012/0106259 A1    May 3, 2012

(51) Int. Cl.
*G11C 11/34* (2006.01)
*G11C 16/04* (2006.01)
*G11C 16/06* (2006.01)

(52) U.S. Cl. .......... 365/185.22; 365/185.24; 365/185.28

(58) Field of Classification Search ............. 365/185.22, 365/185.24, 185.28
See application file for complete search history.

(56) References Cited

U.S. PATENT DOCUMENTS

| 6,212,101 | B1 | 4/2001 | Lee | |
|---|---|---|---|---|
| 6,327,183 | B1 | 12/2001 | Pawletko et al. | |
| 7,151,692 | B2 | 12/2006 | Wu | |
| 7,330,373 | B2 | 2/2008 | Lee et al. | |
| 7,796,439 | B2 * | 9/2010 | Arai et al. | 365/185.22 |
| 2006/0268619 | A1 * | 11/2006 | Chen | 365/185.22 |
| 2008/0181014 | A1 * | 7/2008 | Lee | 365/185.22 |
| 2010/0246272 | A1 * | 9/2010 | Lee | 365/185.19 |
| 2010/0246273 | A1 * | 9/2010 | Ahn | 365/185.22 |
| 2010/0329013 | A1 * | 12/2010 | Shikata et al. | 365/185.18 |

OTHER PUBLICATIONS

"SuperFlash EEPROM Technology," Technical Paper, Silicon Storage Technology, Inc., Nov. 2001, 8 pgs.

* cited by examiner

*Primary Examiner* — Ly D Pham
(74) *Attorney, Agent, or Firm* — Slater & Matsil, L.L.P.

(57) ABSTRACT

A method includes performing a first programming operation on a plurality of memory cells in a same programming cycle; and performing a verification operation on the plurality of memory cells to find failed memory cells in the plurality of memory cells, wherein the failed memory cells are not successfully programmed in the first programming operation; and performing a second programming operation on the failed memory cells. Passed memory cells successfully programmed in the first programming operation are not programmed in the second programming operation.

18 Claims, 3 Drawing Sheets

ADAPTIVE CONTROL OF PROGRAMMING CURRENTS FOR MEMORY CELLS

BACKGROUND

Flash memory has become increasingly popular in recent years. A typical flash memory comprises a memory array having a large number of memory cells arranged in blocks. Each of the memory cells may be fabricated as a field-effect transistor having a control-gate (or a word line) and a floating gate. The floating gate is capable of holding charges and is separated from source and drain regions contained in a substrate by a layer of thin oxide. Each of the memory cells can be electrically charged by injecting electrons from the drain region through the oxide layer onto the floating gate. The charges can be removed from the floating gate by tunneling the electrons to the source through the oxide layer during an erase operation. The data in a memory cell is thus determined by the presence or absence of a charge on the floating gate.

Flash memory cells are arranged as rows and columns to form flash memory arrays. A plurality of bits in a same row can be programmed in the same cycle. A charge pump is used to provide a high voltage and programming currents for programming the plurality of bits. The size of the charge is proportional to the number of bits that are programmed in the same programming cycle. To speed up the programming operation, more bits may be programmed in the same cycle. However, this requires the charge pump to have the capability to provide a greater current. As a result, there is a greater chip-area overhead if more bits are to be programmed in the same programming cycle.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel adaptive programming method for programming memory cells is provided in accordance with an embodiment. The variations and the operation of the embodiment are then discussed. Throughout the various views and illustrative embodiments, like reference numbers are used to designate like elements. It is noted that although flash memory cells are used as examples to explain the concepts of the embodiments, the adaptive programming method in accordance with embodiments may be applied to other types of memory cells.

Figure 1A:
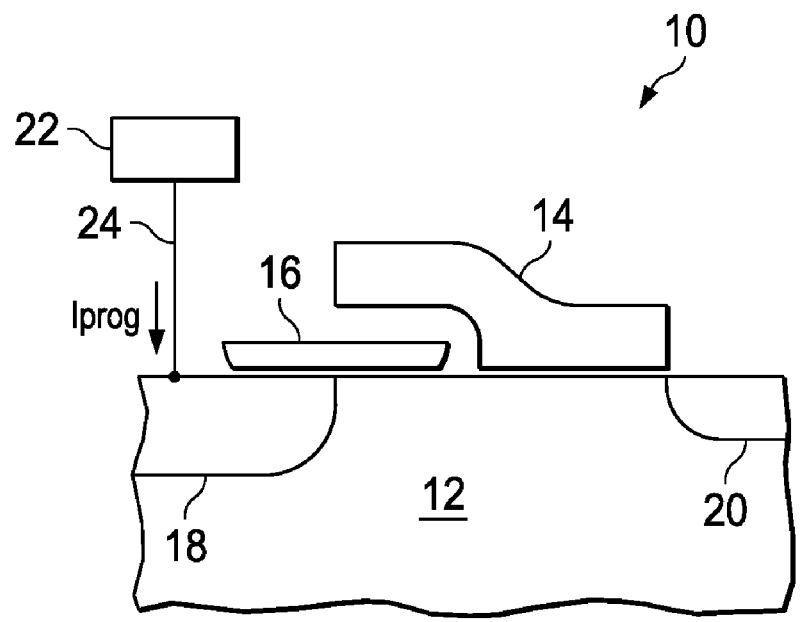
FIGS. 1A and 1B illustrate cross-sectional views of a split gate flash memory cell and a stack gate flash memory cell, respectively.
Figure 1B:
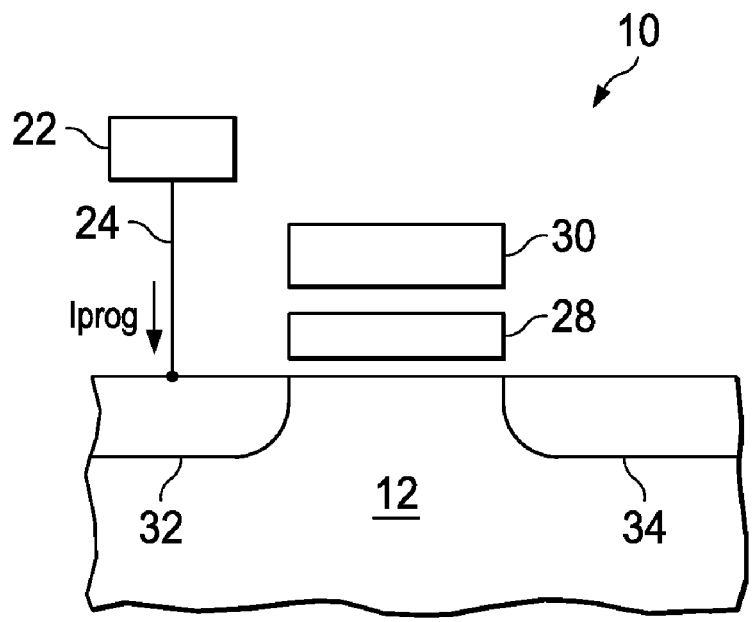

FIGS. 1A and 1B illustrate cross-sectional views of memory cells, on which the adaptive programming may be applied in accordance with embodiments. Referring to FIG. 1A, Memory cell 10 is a split gate flash memory cell formed on substrate 12, and includes word line 14, floating gate 16, source 18, and bit line 20. The dielectric layers such as tunneling layer between word line 14 and floating gate 16 is not shown. In order to program split gate flash memory cell 10, a high voltage, which may be about 10V or even higher, may be provided, for example, by charge pump 22. The programming current is indicated as Iprog, which flows through programming line 24 and passes through source 18.

Alternatively, as shown in FIG. 1B, memory cell 10 may be a stack gate flash memory cell including floating gate 28, control gate 30 over floating gate 28, source 34, and drain 32. The dielectric layers such as tunneling layer and blocking layer are not shown. In this embodiment, programming current Iprog may be provided to drain 32, for example, through charge pump 22. It is realized that depending on the programming mechanisms and programming methods, programming current Iprog may be applied onto different components of memory cells 10 as illustrated in FIGS. 1A and 1B. However, for the components that needs programming voltages, but do not need programming currents, such as word line 14 in FIG. 1A and control gate 30 in FIG. 1B, the adaptive control as in the embodiments may not be needed.

Figure 2:
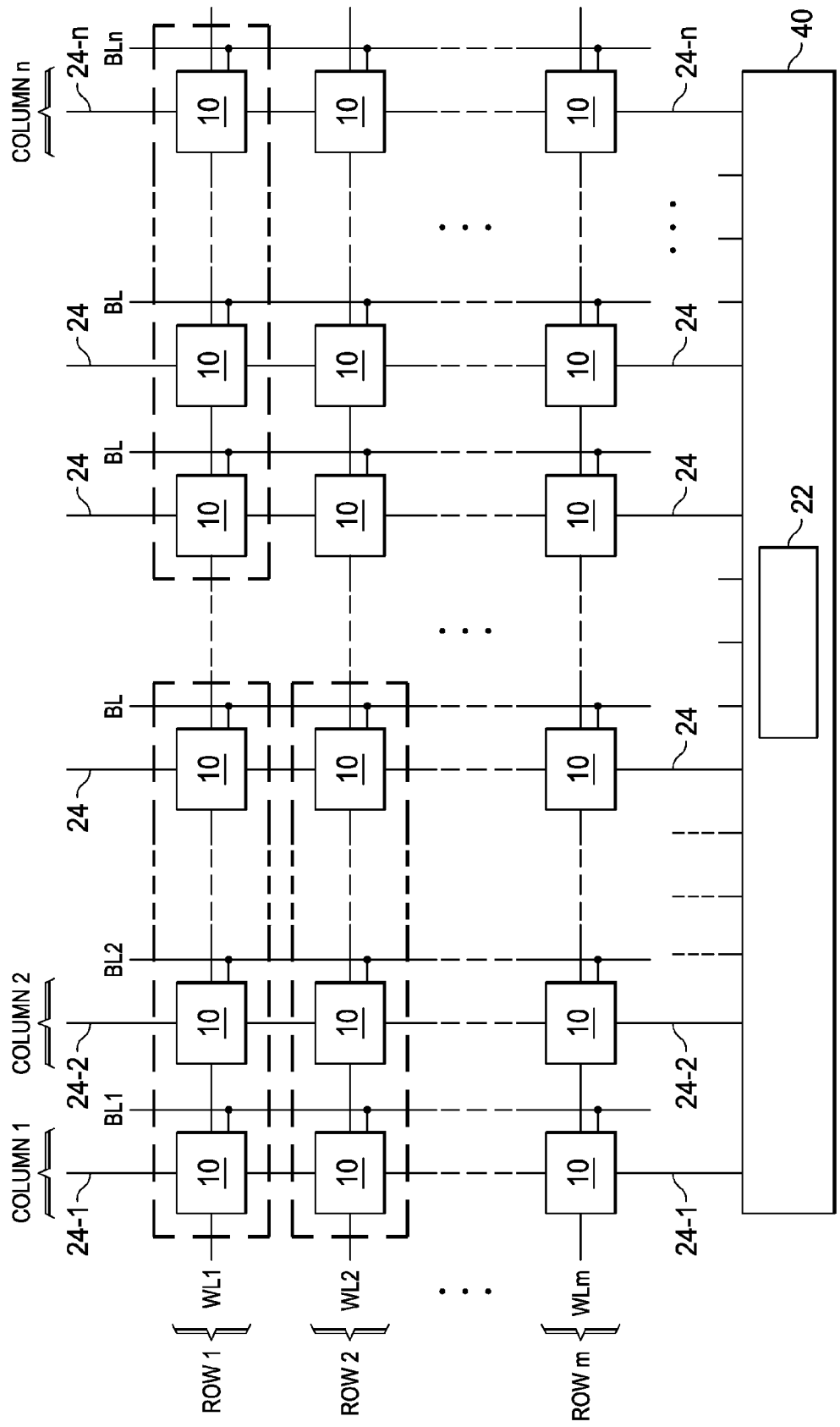
FIGS. 2 and 3 illustrate memory cell arrays, which are programmed using adaptive programming currents.

FIG. 2 illustrates a memory array including a plurality of memory cells 10 arranged as m rows and n columns, wherein m and n are integers. Word lines WL (including WL1 through WLm) extend in the row direction, while bit lines BL (including BL1 through BLn) extend in the column direction. Programming lines 24 (including 24-1 through 24-$n$) may extend in the column direction and parallel to bit lines BL1 through BLn. Each of memory cells 10 may be a split gate flash memory cell as shown in FIG. 1A, a stack gate flash memory cell as shown in FIG. 1B, or another type of memory cell. Further, each of programming lines 24 (including 24-1 through 24-$n$) may be connected to source 18 as shown in FIG. 1A or drain 32 in FIG. 1B, depending on the type of memory cells used in the memory array.

Each row of memory cells 10 may be divided into a plurality of groups (referred to as one-cycle programmable group), wherein the memory cells in the same one-cycle programmable group may be programmed in the same programming cycle. The memory cells in different one-cycle programmable groups are not programmed in the same programming cycle. The memory cells in the same one-cycle programmable group may be in adjacent columns, with no memory cells from other one-cycle programmable groups inserted therebetween. In FIG. 2, dashed frames are used to represent some exemplary one-cycle programmable groups. A one-cycle programmable group may include 8 memory cells (8 bits, or one word, for example), 16 bits, or any other desirable number of bits.

Programming current generator 40 is coupled to programming current lines 24-1 through 24-$n$, and may include charge pump 22 therein for providing the high voltage to programming lines 24 for the programming operation. Programming current generator 42 is configured to provide programming currents to all memory cells in the same one-cycle programmable group, or provide programming currents to any selected one(s) of the memory cells in the same one-cycle programmable group. When the selected one(s) of the memory cells in the same one-cycle programmable group are provided with programming currents, the unselected one(s) of the memory cells in the same one-cycle programmable group are not be provided with programming currents. Accordingly, programming currents may be provided to any combinations of memory cells in any one-cycle programmable group.

In a first step in the programming of a one-cycle programmable group, all memory cells in the one-cycle programmable group are programmed in a same programming cycle. The programming current for each of the memory cell is denoted as Iprog1 (not shown in FIG. 2). To reduce the size of charge pump 22, programming current Iprog1 is relatively small, and the programming of some of memory cells in the one-cycle programmable group may fail, while other memory cells in the one-cycle programmable group are successfully programmed.

In a second step of the programming of the one-cycle programmable group, a verification operation is performed to read the bit values in the one-cycle programmable group. The bit values are then compared to the bit values that are intended to be programmed into the one-cycle programmable group to find out which of the memory cells (referred to as passed memory cells hereinafter) have been successfully programmed. The verification operation is further used to find out which of the memory cells (referred to as failed memory cells hereinafter) have not been successfully programmed, and the bit values stored therein are different from the bit values intended to be programmed into. If the verification confirms that all memory cells in the one-cycle programmable group are successfully programmed, the programming of the one-cycle programmable group is finished.

If the verification operation confirms that at least one memory cell in the one-cycle programmable group failed, then a second programming is performed in a programming cycle to the failed memory cells, while the passed memory cells are not programmed again in the second programming. Programming current generator 42 thus provides programming currents to the failed memory cells in the second programming operation, and not to the passed memory cells.

If a half or more of the memory cells passed in the first programming operation, programming current generator 42 may, or may not, double the programming current for each of the failed memory cells from Iprog1 to 2*Iprog1. Since only a half or fewer than a half of the memory cells in the one-cycle programmable group need to be programmed in the second programming operation, the total programming current for all failed memory cells is still equal to or less than the total programming current (for all memory cells of the one-cycle programmable group) in the first programming operation. With a high programming current 2*Iprog1, the second programming has a higher chance of success for all failed memory cells. Conversely, if the programming of more than a half of the memory cells failed in the first programming operation, programming current generator 42 provides the same programming current Iprog1 to each of the failed memory cells in the second programming operation.

It is likely that in the second programming, there are still failed memory cells. A second verification and possibly a third programming, if needed, may then be performed to find out the remaining failed memory cells that failed in the first and the second programming operations, and re-program the remaining failed memory cells. Similarly, in the third programming, if the number of the remaining failed memory cells is less than or equal to a half of the total number of memory cells in the one-cycle programmable group, the programming current may be set to equal to 2*Iprog1, although it may be set to Iprog1. Otherwise, if the number of the remaining failed memory cells is greater than a half of the total number of memory cells in the one-cycle programmable group, the programming current is set to equal to Iprog1. The steps of verification and re-programming may be repeated until all of the memory cells in the one-cycle programmable group are successfully programmed. Accordingly, a third verification operation, a fourth programming operation, and so on, may be needed.

Figure 3:
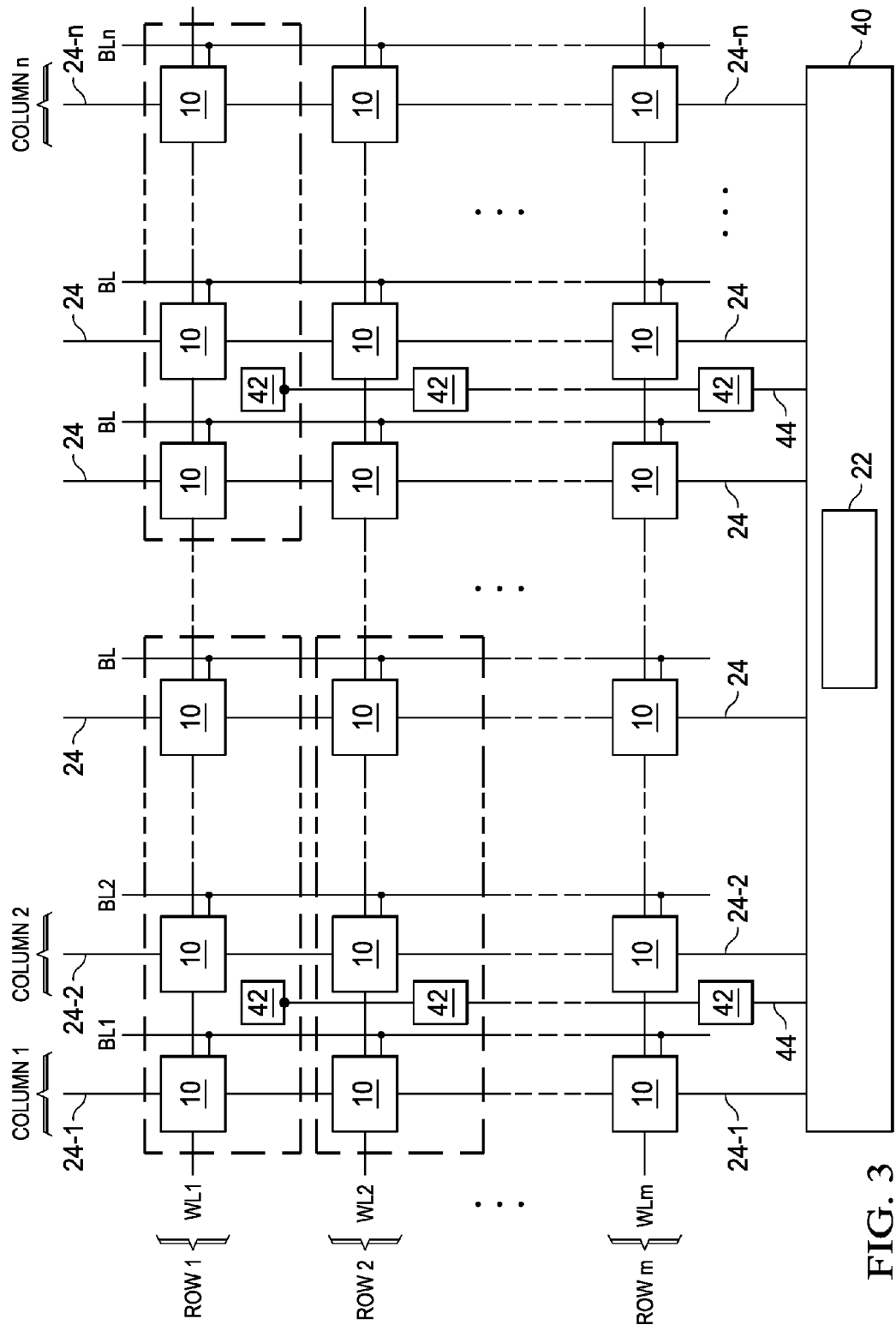

A memory array in accordance with an alternative embodiment is illustrated in FIG. 3, and includes a plurality of memory cells 10 arranged as m rows and n columns. Word lines WL (including WL1 through WLm) extend in the row direction, and bit lines BL (including BL1 through BLn) extend in the column direction. Similarly, each of the memory cells 10 may be a split gate flash memory cell as shown in FIG. 1A, a stack gate flash memory cell as shown in FIG. 1B, or another type of memory cell. Depending on the type of memory cells 10, there may be additional lines including, but not limited to, source lines, control lines, erase gate lines (not shown), and/or the like, connected to the rows and/or columns.

In this embodiment, each row of memory cells 10 is grouped into one or a plurality of one-cycle programmable groups, wherein the memory cells in the same one-cycle programmable group are programmed in the same programming cycle. The memory cells in different one-cycle programmable groups are not programmed in the same programming cycle. Each of the one-cycle programmable group, besides the memory cells, also includes one polarity bit 42, which indicates the polarity of the bit values in the respective one-cycle programmable group. Exemplary one-cycle programmable groups are shown using dashed lines. Polarity bit 42 represents whether the bit values in the memory cells in the respective one-cycle programmable group are inversed in value or not. Throughout the description, bit values "0" and "1" are referred to as being inversed from bit values "1" and "0," respectively. Accordingly, each of the rows may include one or more polarity bits 42, each belonging to one of the one-cycle programmable groups. Each of polarity bits 42 may be coupled to programming voltage generator 40 (or another processing circuit) using a separate polarity line (not shown), or, alternatively, the polarity bits 42 controlling same columns of memory cells may share one of polarity common lines 44. In these embodiments, each of the polarity bits 42 may also be connected to the respective word lines WL, so that each of polarity bits 42 may be selected and accessed by using a respective word line WL and the respective polarity common line 44.

Similarly, programming current generator 42 is coupled to programming current lines 24-1 through 24-n, and may include charge pump 22 therein. Programming current generator 42 is configured to provide programming currents to all memory cells in the same one-cycle programmable group, or provide programming currents to any selected one(s), but not to unselected one(s), of the memory cells in the same one-cycle programmable group.

In a programming operation of the one-cycle programmable group, a plurality of bits (referred to as to-be-programmed bits hereinafter) is to be programmed into a one-cycle programmable group. Accordingly, the count of the to-be-programmed bits is equal to the total number of all memory cells in the one-cycle programmable group. Throughout the description, the total number of all memory cells in the one-cycle programmable group is alternatively referred to as group size. The bit values of the to-be-programmed bits are first examined, and compared to a reference bit value, which can be pre-selected as either "0" or "1." All one-cycle programmable groups in the same memory array may use the same reference bit value. In the following discussion, the reference bit value is selected as being "0" as an example, although it can also be "1." Before the programming, all memory cells in the one-cycle programmable group are initialized to inversed reference bit value, for example, to "1" when the reference bit value is "0." The number (count, also referred to as reference-bit-count hereinafter) of the bits in the to-be-programmed bits and having bit values equal to the reference bit value is calculated, and compared to the group size. The reference-bit-count is used to process the to-be-programmed bits to generate processed bits, which are either identical to, or equal to inversed bits of, the to-be-programmed bits. The processed bits are then programmed into the one-cycle programmable group.

In the step of processing the to-be-programmed bits, if the reference-bit-count is less than (or equal to) a half of the group size, then the respective polarity bit of the one-cycle programmable group is set to "positive," indicating that all bits in the respective one-cycle programmable group have a positive polarity. Otherwise, the respective polarity bit is set to "negative," indicating that all bits in the respective one-cycle programmable group have a negative polarity. Either one of "0" or "1" may be used to represent the positive polarity or the negative polarity. With a "positive" polarity, the processed bits will be identical to the to-be-programmed bits. For example, if "00011111" is to be programmed into a one-cycle programmable group comprising eight bits, since there are three "0" bits, which are less than a half of the group size 8, the polarity bit is set to "positive." The value representing the "positive" polarity is also saved into the polarity bit 42. Further, "00011111" are programmed into the one-cycle programmable group without being inversed.

In the actual programming operation of the processed bits, the bits that are equal to the reference bit value are programmed into corresponding memory cells, while the bits that are equal to the inversed reference bit value are not programmed into corresponding memory cells. Accordingly, programming currents are not provided to the memory cells not programmed. For example, in the case "00011111" are the processed bits, three "0"s are programmed into three of the corresponding memory cells, while the memory cells corresponding to the five "1"s are not programmed, and no programming currents are provided to the corresponding five memory cells. Since these five bits were initialized to the inversed reference bit value "1," they are equivalent to be programmed. Through such a scheme, at most a half of the memory cells in the one-cycle programmable group are actually programmed, and hence the size of the charge pump 22 may be reduced by a half without sacrificing programming reliability.

In a read operation of the one-cycle programmable group, the polarity bit is checked first. When the polarity bit is "positive," the stored bit values that are read from the one-cycle programmable group are outputted directly without being inversed.

Conversely, in the step of processing the to-be-programmed bits, if the reference-bit-count is greater than a half of the group size, then the respective polarity bit is set to "negative," indicating that all bits in the one-cycle programmable group have a negative polarity. With a "negative" polarity, all bits in the to-be-programmed bits are inversed to generate the processed bits, which are actually programmed into the one-cycle programmable group. For example, if "1110000" are the to-be-programmed bits for a one-cycle programmable group comprising eight bits, since there are five bits, which are more than a half of the group size, having values equal to the reference bit value "0," the polarity bit is thus set to "negative." Each of the bits in the to-be-programmed bits "1110000" is inversed to generate processed bits "00011111," which are actually programmed into the one-cycle programmable group. The value representing the "negative" polarity is also saved into polarity bit 42 of the respective one-cycle programmable group. Similarly, in the programming operation of the processed bits, the bits that are equal to the reference bit value are actually programmed into corresponding memory cells, while the bits having bit values equal to the inversed reference bit value are not programmed into corresponding memory cells, since they have already been initialized to the inversed reference bit value. In the above-recited example, three bits are programmed, and five bits are not programmed.

In a read operation of the one-cycle programmable group, the polarity bit is checked first. When the polarity bit is found to be "negative," the stored bit values read from the one-cycle programmable group, which are "00011111," for example, are inverted to generate inversed bits "1110000." The inversed bit values "1110000" are then outputted for further processing.

If the number of "1"s and "0" in the to-be-programmed bits is equal to a half of the group size, polarity bit 42 may be set to either "positive" or "negative." However, the rule for setting polarity bits is uniformly applied to the entire memory array. Correspondingly, the inverse operation of bits may be, or may not be, performed, depending on the polarity bit.

In alternative embodiments, instead of initializing all bits in a one-cycle programmable group as "1"s, the bits can also be initialized as "0"s. Accordingly, the number of "1"s in the to-be-programmed bits is summed to determine whether an inverse operation of the to-be-programmed bit values is needed before the actual programming is performed. In these embodiments, if the number of "1"s is less than a half of the group size of the one-cycle programmable group, to which the to-be-programmed bits are programmed, an inverse operation is not needed, and the respective polarity bit 42 is set to "positive." Conversely, if the number of "1" is greater than a half of the group size, an inverse is needed, and the polarity bit is set to "negative." If the number of "1"s and "0" in the one-cycle programmable group are equal to a half of the group size, the polarity bit may be set to either "positive" or "negative."

In the above-discussed programming and read operations, the checking of the to-be-programmed bits to determine polarity, the generation of processed bits, the setting of polarity bit 42, the checking of the polarity bit before the read operation, and the inverse of the values read from the one-cycle programmable group may all be performed by programming current generator 40, or by additional circuits (not shown) in combination with programming current generator 40.

Through the used of the polarity bit and the respective inverse operations on bit values, at most a half of the total number of memory cells in a one-cycle programmable group is actually programmed, and the total programming current required to program the entire one-cycle programmable group is reduced by a half. The size of the charge pump 22 may thus be reduced by a half.

In accordance with embodiments, a method includes performing a first programming operation on a plurality of memory cells in a same programming cycle; and performing a verification operation on the plurality of memory cells to find failed memory cells in the plurality of memory cells, wherein the failed memory cells are not successfully programmed in the first programming operation; and performing a second programming operation on the failed memory cells. Passed memory cells successfully programmed in the first programming operation are not programmed in the second programming operation.

In accordance with other embodiments, a method includes, in a same programming cycle, performing a first programming operation on a plurality of memory cells in a same one-cycle programmable group, wherein each of the plurality of memory cells is programmed using a first programming current. A verification operation is performed on the plurality of memory cells to find failed memory cells in the plurality of memory cells, wherein the failed memory cells are not successfully programmed in the first programming operation. A first total number of the failed memory cells is compared with a second total number of the plurality of memory cells to select a second programming current. When the first total number is greater than a half the second total number, the second programming current is equal to the first programming current. When the first total number is equal to or less than the second total number, the second programming current is equal to two times the first programming current. A second programming operation is performed on the failed memory cells with each of the failed memory cells applied with the second programming current. Passed memory cells successfully programmed in the first programming operation are not programmed in the second programming operation.

In accordance with yet other embodiments, a method includes receiving a plurality of bits, wherein the plurality bits are to be programmed into a plurality of memory cells in a same one-cycle programmable group, and wherein each of the plurality of bits corresponds to one of the plurality of memory cells. A count of bits in the plurality of bits having a reference bit value is calculated, wherein the reference bit value is selected from the group consisting essentially of "0" and "1." The count is compared with a half of a total number of the plurality of memory cells. The one-cycle programmable group is programmed with processed bits, with each of plurality of memory cells programmed with one of the processed bits in a same programming cycle. When the count is less than the half of the total number of the plurality of memory cells, the processed bits are identical to the plurality of bits. When the count is greater than the half of the total number of the plurality of memory cells, each of the processed bits is equal to an inversed bit of a respective one of the plurality of bits. When the count is equal to the half of the total number of the plurality of memory cells, each of the processed bits is equal to a respective one of the plurality of bits, or equal to an inversed bit of a respective one of the plurality of bits.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    performing a first programming operation on a plurality of memory cells in a same programming cycle, wherein in the first programming operation, each of the plurality of memory cells is applied with a first programming current;
    performing a first verification operation on the plurality of memory cells to find failed memory cells in the plurality of memory cells, wherein the failed memory cells are not successfully programmed in the first programming operation; and
    performing a second programming operation on the failed memory cells, wherein passed memory cells successfully programmed in the first programming operation are not programmed in the second programming operation, and wherein in the second programming operation, each of the failed memory cells is applied with a second programming current greater than a first programming current.

2. The method of claim 1 further comprising, after the first programming operation and before the first verification operation:
    comparing a number of the failed memory cells with a total number of the plurality of memory cells, wherein a first programming current is used for programming each of the failed memory cells in the second programming operation when the number of the failed memory cells is greater than a half the total number of the plurality of memory cells, and a second programming current is used for programming each of the failed memory cells in the second programming operation when the number of the failed memory cells is equal to or less than a half of the total number of the plurality of memory cells, and wherein the first programming current is different from the second programming current.

3. The method of claim 1, wherein the second programming current is equal to two times the first programming current.

4. The method of claim 1, wherein the plurality of memory cells are in a same word of a memory array.

5. The method of claim 1 further comprising:
    after the second programming operation, performing a second verification operation on the plurality of memory cells to determine remaining failed memory cells; and
    performing a third programming operation on the remaining failed memory cells, wherein passed memory cells successfully programmed in the first and the second programming operations are not programmed in the third programming operation.

6. A method comprising:
    in a same programming cycle, performing a first programming operation on a plurality of memory cells in a same one-cycle programmable group, wherein each of the plurality of memory cells is programmed using a first programming current;
    performing a first verification operation on the plurality of memory cells to find failed memory cells in the plurality of memory cells, wherein the failed memory cells are not successfully programmed in the first programming operation;
    comparing a first total number of the failed memory cells with a second total number of the plurality of memory cells to select a second programming current, wherein when the first total number is greater than a half the second total number, the second programming current is equal to the first programming current, and wherein when the first total number is equal to or less than the second total number, the second programming current is equal to two times the first programming current; and performing a second programming operation on the failed memory cells with each of the failed memory cells applied with the second programming current, wherein passed memory cells successfully programmed in the first programming operation are not programmed in the second programming operation.

7. The method of claim 6, wherein the plurality of memory cells in the same one-cycle programmable group are in a same row of a memory array, and wherein the same row further comprises a plurality of one-cycle programmable groups.

8. The method of claim 7, wherein when the first programming operation is performed, none of the plurality of one-cycle programmable groups in the same row is programmed.

9. The method of claim 6 further comprising:
after the step of performing the second programming operation, finding remaining failed memory cells in the one-cycle programmable group; and
programming the remaining failed memory cells using two times the first programming current.

10. The method of claim 6, wherein the plurality of memory cells are flash memory cells.

11. The method of claim 6, wherein the first and the second programming currents are applied on programming lines of a memory array, and wherein the programming lines of the memory array are selected from the group consisting essentially of source lines and drain lines.

12. A method comprising:
receiving a plurality of bits, wherein the plurality bits are to be programmed into a plurality of memory cells in a same one-cycle programmable group, and wherein each of the plurality of bits corresponds to one of the plurality of memory cells;
calculating a count of bits in the plurality of bits having a reference bit value selected from the group consisting essentially of "0" and "1";
comparing the count with a half of a total number of the plurality of memory cells; and
programming the one-cycle programmable group with processed bits, with each of plurality of memory cells programmed with one of the processed bits in a same programming cycle, wherein:
when the count is less than the half of the total number of the plurality of memory cells, the processed bits are identical to the plurality of bits;
when the count is greater than the half of the total number of the plurality of memory cells, each of the processed bits is equal to an inversed bit of a respective one of the plurality of bits; and when the count is equal to the half of the total number of the plurality of memory cells, each of the processed bits is equal to a respective one of the plurality of bits, or equal to an inversed bit of a respective one of the plurality of bits.

13. The method of claim 12 further comprising, before the step of receiving, initializing the plurality of memory cells with an inversed bit of the reference bit value, wherein during the step of programming the one-cycle programmable group, portions of the plurality of memory cells corresponding to the portions of the plurality of bits having bit values equal to an inversed bit value of the reference bit value are not programmed.

14. The method of claim 12 further comprising:
when the count is less than the half of the total number of the plurality of memory cells, setting a polarity bit of the one-cycle programmable group to a positive polarity;
when the count is greater than the half of the total number of the plurality of memory cells, setting the polarity bit to a negative polarity; and
when the count is equal to the total number of the plurality of memory cells, setting the polarity bit to a value selected from the group consisting essentially of the positive polarity and the negative polarity.

15. The method of claim 12 further comprising:
performing a reading operation on the same one-cycle programmable group to obtained stored bit values;
checking a polarity bit of the same one-cycle programmable group; and
performing a step selected from the group consisting essentially of:
when the polarity bit indicates a positive polarity, outputting the stored bit values; and
when the polarity bit indicates a negative polarity, outputting inversed bits of the stored bit values.

16. The method of claim 12, wherein the plurality of memory cells are flash memory cells.

17. The method of claim 12, wherein the plurality of memory cells are in a row of a memory array, and wherein the row further comprises a plurality of one-cycle programmable groups, with each of the plurality of one-cycle programmable groups comprising a polarity bit representing a plurality of bits stored in a respective one of the plurality of one-cycle programmable groups.

18. The method of claim 12, wherein when the count is equal to the half of the total number of the plurality of memory cells, each of the processed bits is identical to a respective one of the plurality of bits.

* * * * *